(12) United States Patent
Behringer et al.

(10) Patent No.: US 9,466,764 B2
(45) Date of Patent: Oct. 11, 2016

(54) OPTOELECTRONIC COMPONENT INCLUDING A SUBSTRATE ON WHICH A SEMICONDUCTOR LAYER SEQUENCE WITH AN IDENTIFIER FOR IDENTIFYING THE COMPONENT IS APPLIED

(71) Applicant: OSRAM Opto Semiconductors GmbH, Regensburg (DE)

(72) Inventors: Martin Rudolf Behringer, Regensburg (DE); Christoph Klemp, Regensburg (DE); Markus Broell, Freising (DE)

(73) Assignee: OSRAM OPTO SEMICONDUCTORS GMBH, Regensburg (DE)

( * ) Notice: Subject to any disclaimer, the term of this patent is extended or adjusted under 35 U.S.C. 154(b) by 20 days.

(21) Appl. No.: 14/430,897

(22) PCT Filed: Sep. 25, 2013

(86) PCT No.: PCT/EP2013/069964
§ 371 (c)(1),
(2) Date: Mar. 24, 2015

(87) PCT Pub. No.: WO2014/048987
PCT Pub. Date: Apr. 3, 2014

(65) Prior Publication Data
US 2015/0236199 A1 Aug. 20, 2015

(30) Foreign Application Priority Data
Sep. 27, 2012 (DE) .......................... 10 2012 217 539

(51) Int. Cl.
*H01L 33/08* (2010.01)
*H01L 21/66* (2006.01)
*H01L 33/20* (2010.01)
*H01L 33/00* (2010.01)
*G06K 19/06* (2006.01)
*G06K 19/067* (2006.01)

(52) U.S. Cl.
CPC ............. *H01L 33/20* (2013.01); *G06K 19/067* (2013.01); *G06K 19/06028* (2013.01); *H01L 33/005* (2013.01)

(58) Field of Classification Search
CPC ............................ H01L 33/20; H01L 33/005
See application file for complete search history.

(56) References Cited

U.S. PATENT DOCUMENTS

| 2003/0225473 A1 | 12/2003 | Yamazaki | |
| 2009/0050198 A1 | 2/2009 | Mueller et al. | |
| 2012/0074438 A1* | 3/2012 | Hwang | H01L 33/0095 257/88 |
| 2013/0037838 A1* | 2/2013 | Speier | H01L 51/5036 257/98 |

FOREIGN PATENT DOCUMENTS

| DE | 10219346 A1 | 11/2003 |
| WO | 92/10852 A1 | 6/1992 |

\* cited by examiner

*Primary Examiner* — Thomas L Dickey
*Assistant Examiner* — Damon Hillman
(74) *Attorney, Agent, or Firm* — McDermott Will & Emery LLP

(57) ABSTRACT

The invention relates to an optoelectronic component (101, 301, 501), comprising a substrate (103, 303, 503), on which a semiconductor layer sequence (105, 305, 505) has been placed, wherein the semiconductor layer sequence (105, 305, 505) has at least one identifier (115, 315) for identifying the component (101, 301, 501). The invention also relates to a method for producing an optoelectronic component (101, 301, 501).

14 Claims, 10 Drawing Sheets

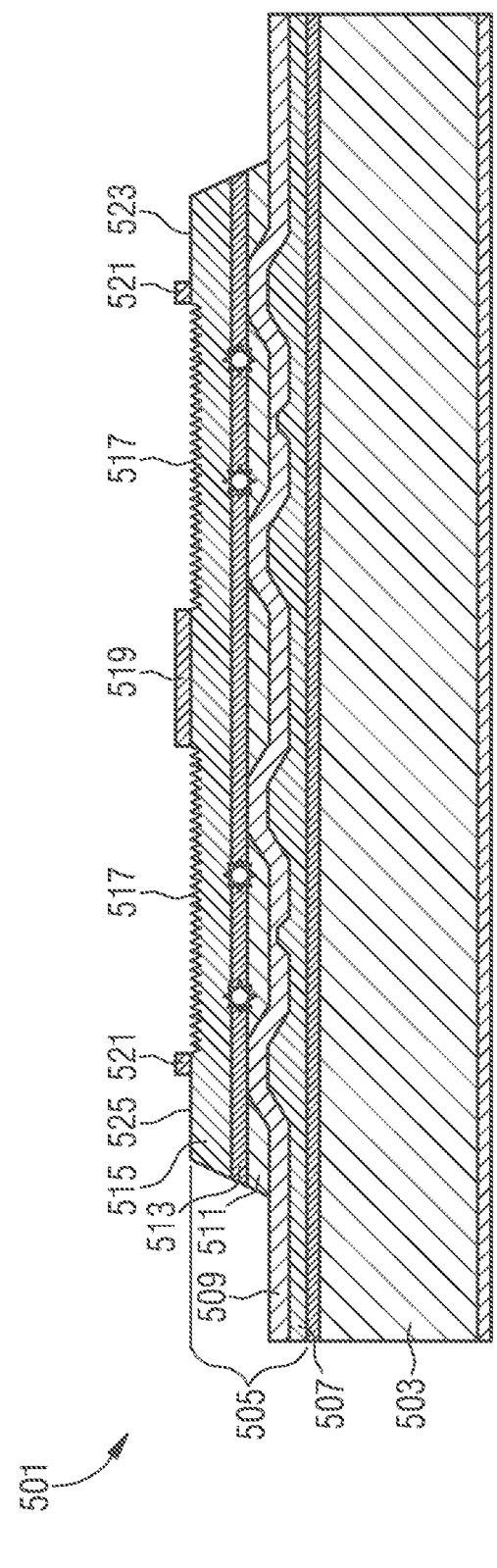

Figure 1:
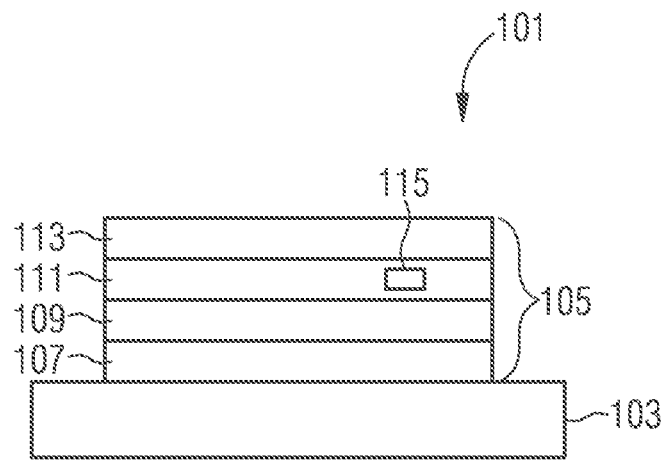

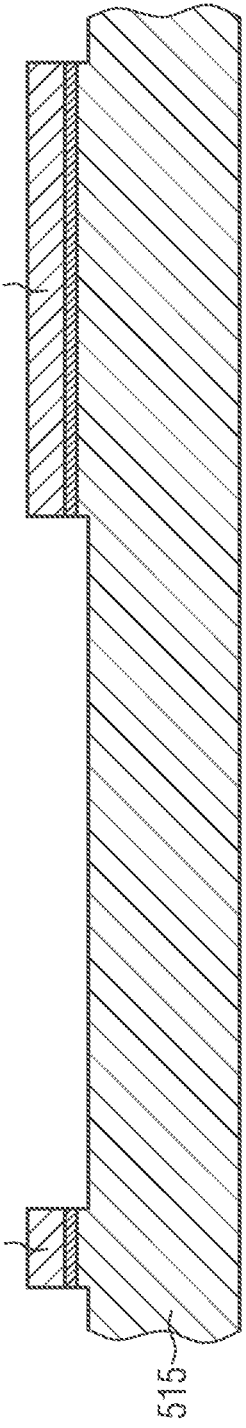
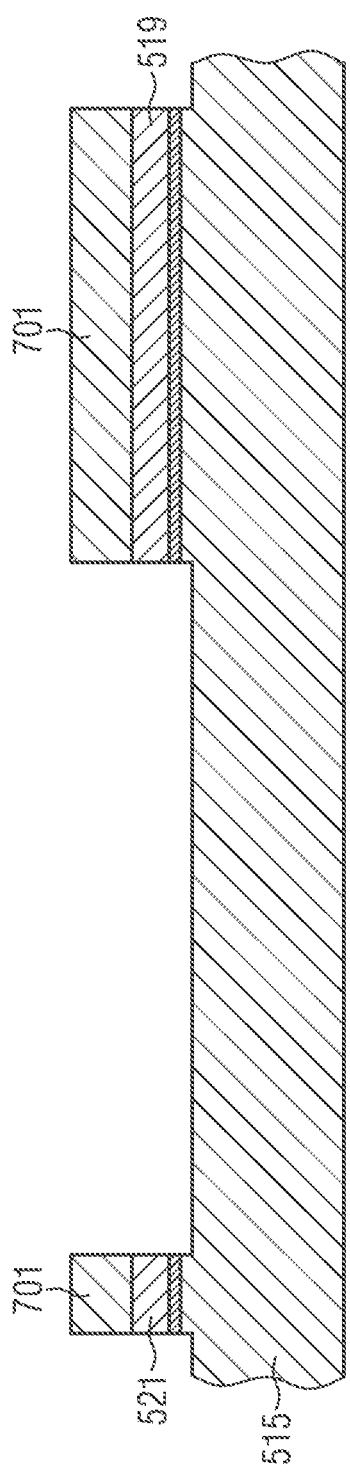

OPTOELECTRONIC COMPONENT INCLUDING A SUBSTRATE ON WHICH A SEMICONDUCTOR LAYER SEQUENCE WITH AN IDENTIFIER FOR IDENTIFYING THE COMPONENT IS APPLIED

The invention relates to an optoelectronic component. The invention furthermore relates to a method for producing an optoelectronic component.

This patent application claims the priority of German patent application 10 2012 217 539.3, the disclosure content of which is hereby incorporated by reference.

The published patent application WO 92/10852 A1 discloses semiconductor chips of identical type which are produced on a common plate and then singulated. After the formation of the semiconductor chips on the common plate, identifications are formed alongside the semiconductor chips, but on the plate, said identifications each corresponding to a position of the semiconductor chips on the common plate. After the singulation of the semiconductor chips, the latter each comprise this edge region of the former common plate, such that knowledge about their earlier position on the common plate is still possible.

What is disadvantageous about that is, in particular, that this type of marking takes up a great deal of space, insofar as enough space for these identifications always has to be reserved on the common plate, in which case this reserved space then can no longer be available for the chip itself.

The problem addressed by the invention can therefore be considered that of specifying an improved optoelectronic component which overcomes the known disadvantages.

The problem addressed by the invention can also be considered that of providing a corresponding method for producing an optoelectronic component.

These problems are solved by means of the respective subject matter of the independent claims. Advantageous configurations are the subject matter of the respective dependent subclaims.

According to one aspect, an optoelectronic component is provided. The component comprises a substrate, on which a semiconductor layer sequence is applied. The semiconductor layer sequence has at least one identifier for identifying the component.

In accordance with a further aspect, a method for producing an optoelectronic component is specified. A semiconductor layer sequence is formed on a growth substrate. Furthermore, the semiconductor layer sequence is provided with an identifier for identifying the component.

The invention therefore encompasses the concept, in particular, of providing an identifier for identifying the component, the semiconductor layer sequence directly comprising said identifier. Therefore, in an advantageous manner, it is no longer necessary to reserve area on a growth substrate for corresponding identifications. Consequently, an available area of a growth substrate can be utilized particularly efficiently for the growth of the individual semiconductor layers of the semiconductor layer sequence. That is to say, in particular, that, in comparison with the known prior art, more optoelectronic components can be formed on a common growth substrate, yet an identification of the respective optoelectronic components is nevertheless still made possible by means of the identifier of the semiconductor layer sequence.

Furthermore, it is advantageously possible to remove the growth substrate after the formation of the semiconductor layer sequence comprising the identifier and subsequently to arrange the semiconductor layer sequence onto a further substrate or a film, without the possibility of an identification of the optoelectronic component being lost. This is because the identifier is not part of the growth substrate, but rather part of the semiconductor layer sequence itself.

An identifier within the meaning of the present invention can in particular also be designated as a marker and brings about in particular in an advantageous manner an unambiguous identification of the optoelectronic component. The identifier can comprise for example a number code, a letter code or a letter-number code. By way of example, the identifier can comprise a color code. That is to say, in particular, that numbers, letters or colors can be used to identify the optoelectronic component. By means of the identifier, a differentiation of the optoelectronic component in relation to further optoelectronic components is thus made possible in particular in an advantageous manner. That is to say, in particular, that if a multiplicity of optoelectronic components are formed on a common growth substrate, they can be differentiated from one another. In particular, the identifier comprises position information regarding a position of the semiconductor layer sequence on the growth substrate.

According to one embodiment, a plurality of identifiers can be formed. The latter can preferably be formed identically or in particular differently. The provision of a plurality of identifiers advantageously results in a redundancy to the effect that even in the case of a failure of an identifier, that is to say if the latter can no longer be read reliably, for example, at least one further identifier is still always provided for identifying the component. The explanations given in connection with one identifier analogously apply to embodiments with a plurality of identifiers.

In accordance with one embodiment it can be provided that the semiconductor layer sequence comprises an active zone for generating electromagnetic radiation. The active zone can be formed as an emitter layer, for example.

In accordance with another embodiment it can be provided that provision is made of a coupling-out layer for coupling out the electromagnetic radiation from the active zone or from the emitter layer.

In accordance with another embodiment it can be provided that the identifier comprises a coded structured region of a layer of the layers of the semiconductor layer sequence. That is to say, in particular, that a region of the layer is structured in such a way that a code is coded in the structured region. The region is therefore structured in particular in a coding fashion.

In accordance with an embodiment it can be provided that the coded structured region comprises a coded surface structure of the coupling-out layer. That is to say, in particular, that a code is written or coded into the surface of the coupling-out layer by the surface of the coupling-out layer being structured correspondingly in a coding fashion. By way of example, it can be provided that the surface of the coupling-out layer is structured in a coding fashion by means of a stamp.

In accordance with a further embodiment it can be provided that the coded structured region is formed as a barcode. In particular, the barcode can be formed as a one-dimensional barcode or as a two-dimensional barcode. In particular, a plurality of barcodes are provided, which can be formed in particular identically or preferably differently.

The coded structured region of the layer of the layers of the semiconductor layer sequence can for example be provided in the layer itself or be formed in particular on the surface of the layer. It can be provided, in particular, that one or a plurality of further layers are applied or arranged on the layer having the coded surface structure. By way of example, such a layer can be formed as a converter layer for converting electromagnetic radiation having a first wavelength into electromagnetic radiation having a second wavelength.

According to one embodiment it can be provided that the region comprises a coded structured surface coating of the layer. That is to say, in particular, that the surface of the layer is coated, wherein this coating is structured in a coding fashion in such a way that a code is coded or written in the structured surface coating.

According to one embodiment it can be provided that the surface coating is an antireflection coating.

According to a further embodiment it can be provided that a position of the semiconductor layer sequence on the growth substrate is coded into the identifier. That is to say, in particular, that a later determination of the position of the optoelectronic component comprising the semiconductor layer sequence relative to its growth substrate is also made possible in an advantageous manner as a result. The knowledge of a position of an optoelectronic component on a growth substrate, which can generally be a wafer, in particular, advantageously enables in particular a targeted reduction of a fault rate and thus an increase in a production yield and a reliability.

Preferably, a multiplicity of semiconductor layer sequences are formed on a growth substrate, in particular a wafer, wherein an identification of the semiconductor layer sequences is made possible by means of a respective identifier. In particular, knowledge about the respective position of the semiconductor layer sequences on the growth substrate is made possible on account of the provision of the identifiers.

That is to say, in particular, that the position of each individual optoelectronic component on the growth substrate, in particular on the wafer, can still be reproduced even after a separation or singulation of the individual optoelectronic components, without additional costs arising or a performance or productivity of the optoelectronic component decreasing in this case. As a result of the knowledge of the position of the optoelectronic component, a multiplicity of fault causes can be identified even more rapidly afterward, that is to say in particular after the separation. It is possible to reproduce, in particular, whether or not specific faults occur in an edge region of the growth substrate. That advantageously makes it possible to improve a quality in particular afterward.

According to one embodiment it can be provided that the substrate corresponds to a separated part of the growth substrate.

According to one embodiment it can be provided that the step of providing the semiconductor layer sequence with the identifier comprises forming a coded structured region of a layer of the layers of the semiconductor layer sequence.

In accordance with a further embodiment it can be provided that forming the coded structured region comprises applying a coded structured surface coating on the layer, wherein a location of the surface coating on the layer is chosen depending on the position of the semiconductor layer sequence on the growth substrate.

That is to say, in particular, that the surface coating is not applied to the layer, that is to say to the surface thereof, randomly, but rather depending on the position of the semiconductor layer sequence on the growth substrate. Consequently, a plurality of optoelectronic components on a common growth substrate differ at least in that a respective location of their surface coatings is different. A simple and particularly cost-effective identification of the individual optoelectronic components can thus be brought about.

In accordance with one embodiment it can be provided that the surface coating is formed as an antireflection coating.

According to one embodiment it can be provided that forming the semiconductor layer sequence comprises forming an active zone for generating electromagnetic radiation.

According to a further embodiment it can be provided that forming the semiconductor layer sequence comprises forming a coupling-out layer for coupling out the electromagnetic radiation from the active zone.

In accordance with a further embodiment it can be provided that forming the coded structured region comprises forming a coded surface structure of the coupling-out layer. The coupling-out layer has, in particular, a coded surface structure.

According to one embodiment it can be provided that a location of the coded surface structure on the coupling-out layer is chosen depending on the position of the semiconductor layer sequence on the growth substrate.

That is to say, in particular, that although the coupling-out layer is provided with a coded surface structure, the latter is not formed on the coupling-out layer purely randomly, but rather depending on the position of the semiconductor layer sequence on the growth substrate. That is to say, in particular, that, in the case of a multiplicity of optoelectronic components on a common growth substrate, they differ at least to the effect that a location of their respective coded surface structure on the coupling-out layer is different. Simple and particularly cost-effective differentiability and corresponding identification is advantageously made possible as a result.

According to one embodiment it can be provided that the entire surface of the coupling-out layer is provided with a coded surface structure. That is to say, in particular, that the entire surface of the coupling-out layer is structured in a coding fashion. In particular, only one portion of the surface of the coupling-out layer is provided with a coded surface structure. In particular, it can be provided in this case that said portion is formed from two or more regions separated from one another.

The provision of a coded structured surface structure formed over the whole area on the coupling-out layer advantageously has the effect that the surface structure additionally also contributes to the coupling out of the electromagnetic radiation. That is to say, in particular, that a coupling-out efficiency of the coupling-out layer is increased. This is the case particularly if the dimensions or dimensioning of the surface structure are of the order of magnitude of the wavelength of the electromagnetic radiation.

Even if only one portion of the surface is correspondingly structured in a coding fashion, this nevertheless contributes to the coupling out of the electromagnetic radiation.

According to another embodiment it can be provided that forming the coded surface structure is carried out by means of an imprint method and/or a photolithography method and/or by means of an electron beam and/or by means of a laser beam.

By means of the electron beam or laser beam, in particular a photoresist can be correspondingly structured in a coding fashion. Preferably, a surface of the coupling-out layer can alternatively or additionally be structured directly in a coding fashion. That is to say, in particular, that the laser or electron beam burns or writes the coded structure directly into the surface of the coupling-out layer.

In a photolithography method it can be provided, in particular, that a photoresist is exposed, in particular exposed over the whole area, by means of a mask aligner and/or a scanner, such that the coded surface structure is correspondingly formed. Here it can then be provided, for example, that the coded surface structure formed by means of the photolithography method is further roughened more finely by means of spheres (cf. following description of figures), in particular by means of polystyrene spheres, such that efficient coupling out of light is brought about on account of this finer roughening, without the coding being lost, however, in the process.

In particular, a photoresist can be exposed by means of a stepper with a fixed mask, wherein here it is provided, in particular, that the stepper does not expose the surface as a whole, but rather portions or regions of the surface. Consequently, high resolutions for the coded structure are advantageously made possible. X-ray radiation, in particular, can be used for the exposure.

In an imprint method it can be provided, in particular, that a resist layer is applied on the surface, which is structured in a coding fashion by means of a stamp. That is to say, in particular, that the coded structure is introduced or written or stamped onto the surface by means of a stamp. Such a stamp can preferably comprise a negative image of all surfaces of the components on a wafer, in particular including their individual marking. The stamping is preferably followed by an exposure and in particular a curing of the resist layer, wherein the resist can also be designated as an imprint resist. Afterward, it can preferably be provided that plasma etching is carried out, such that the resist structure is transferred to the surface.

An imprint method has the advantage, in particular, that particularly small coded structures can be formed. These small structures are suitable in particular for coupling out light, and thus advantageously increase a coupling out of light. Furthermore, advantageously only one structuring step is thus necessary: the stamping.

It can be provided in particular, that, in the case of a multiplicity of components on a common wafer, a stamp is used which covers the wafer as a whole and which in this respect can mark or structure the components in a single stamping step. A stamp can be structured in a coding fashion in particular by means of an electron beam and/or by means of a laser lithography method, such that the structure of the stamp can be transferred to the surface.

Very generally, the marking or the identifier in particular is preferably formed directly in a region of the semiconductor layer sequence that emits electromagnetic radiation. This region is formed in particular on the surface of the coupling-out layer. That is to say, in particular, that the radiation generated in the active zone leaves the semiconductor layer sequence through this region.

Figure 2:
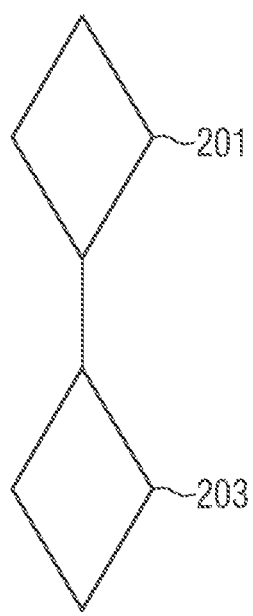
Figure 3:
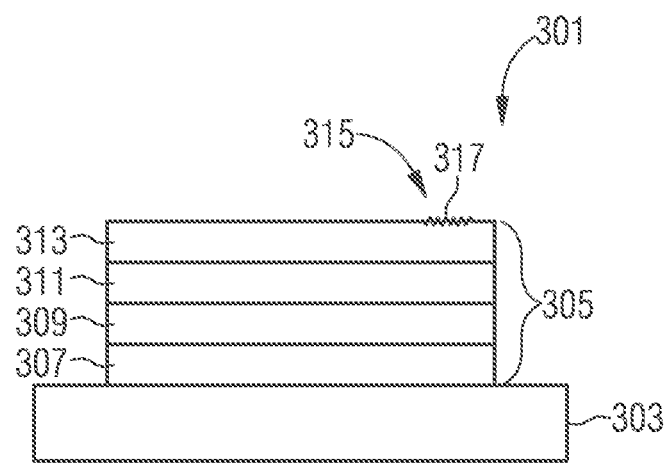
Figure 4:
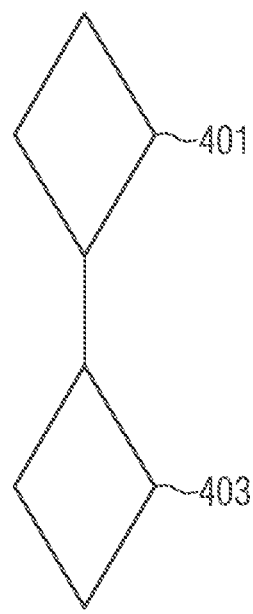
Figure 10:
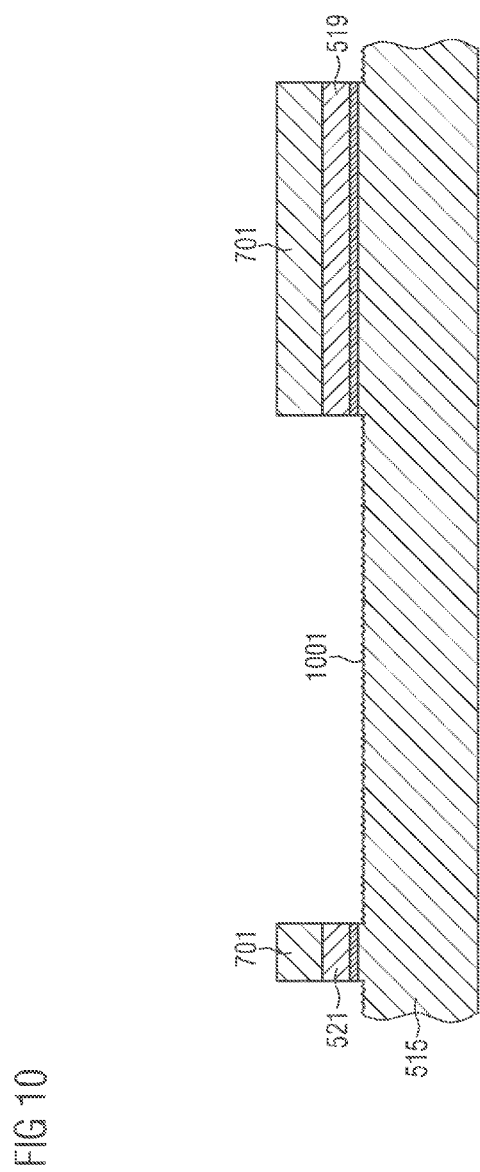
Figure 11:
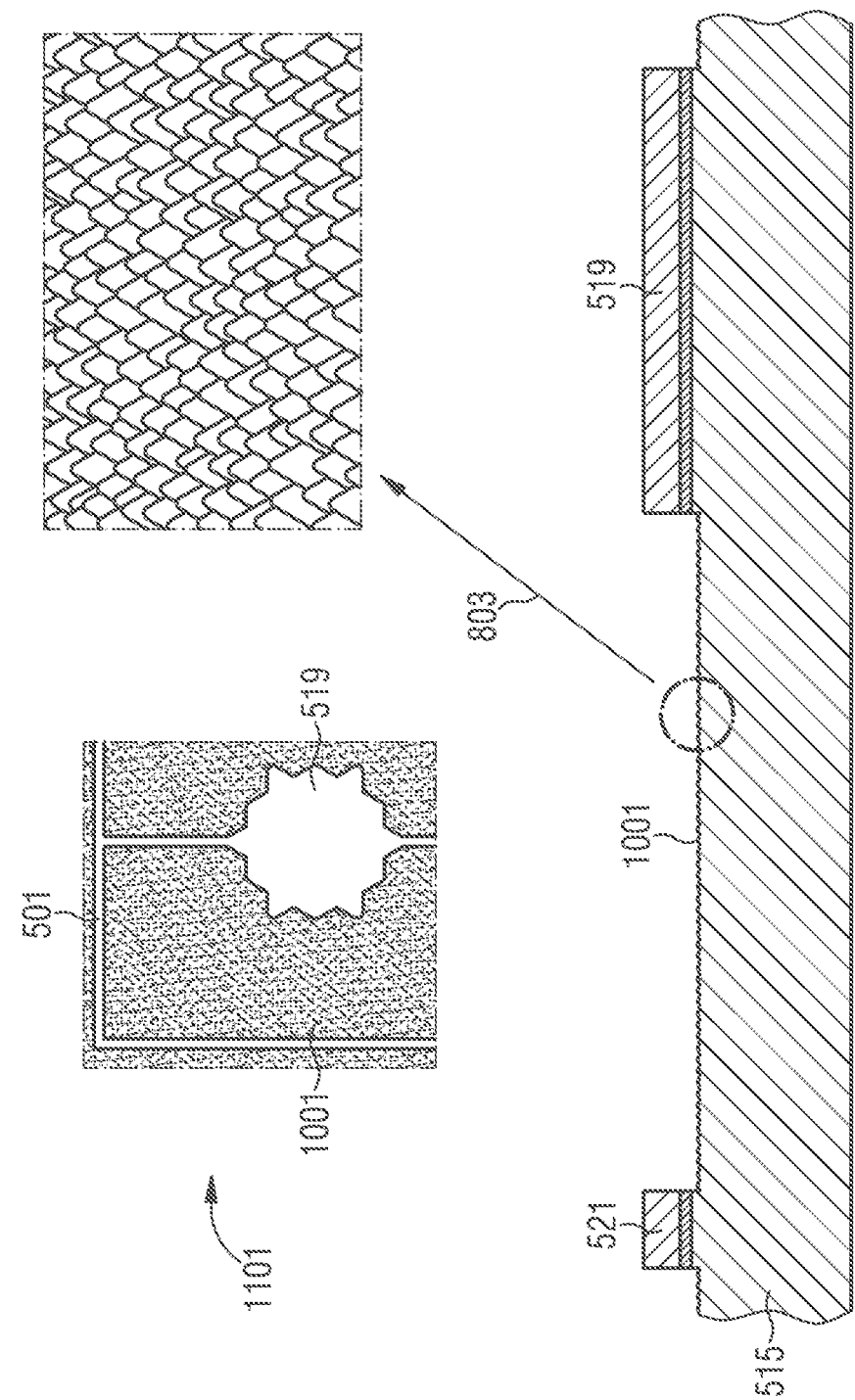
Figure 12:
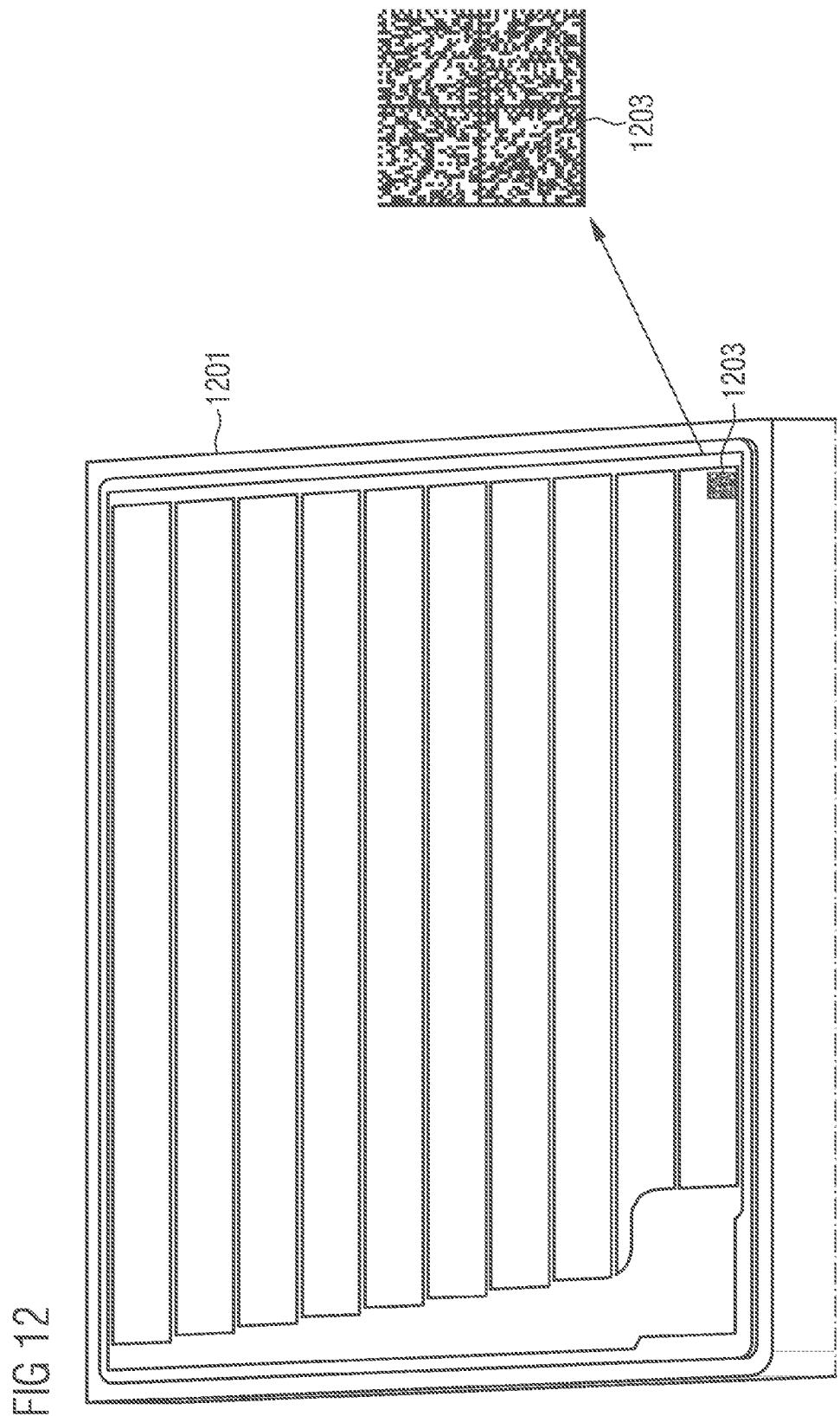
Figure 13:
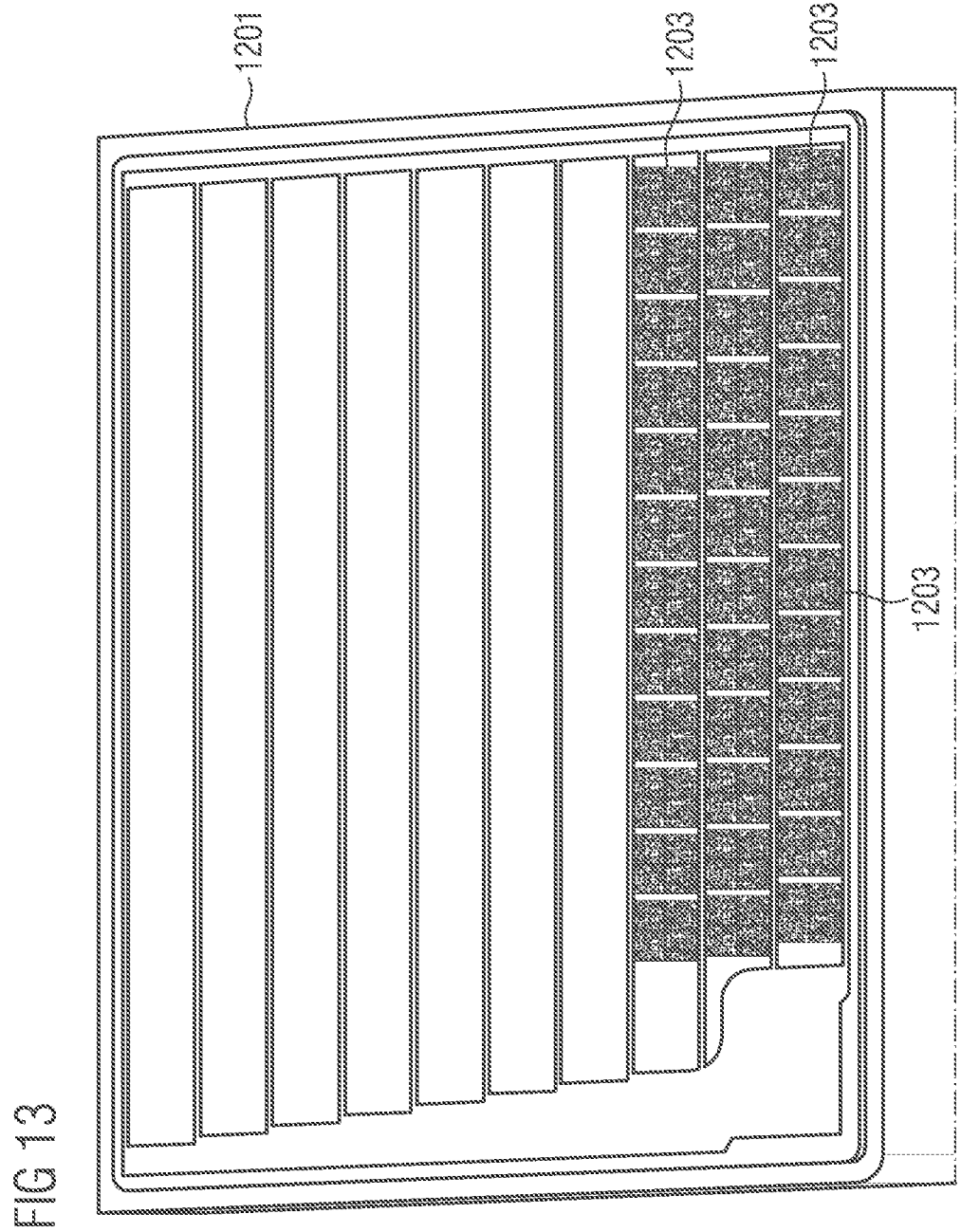

The invention is explained in greater detail below on the basis of preferred exemplary embodiments. In the figures:

FIG. 1 shows an optoelectronic component,

FIG. 2 shows a flow diagram of a method for producing an optoelectronic component, FIG. 3 shows a further optoelectronic component, FIG. 4 shows a flow diagram of a further method for producing an optoelectronic component, FIG. 5 shows a different optoelectronic component, FIGS. 6-11 show various views of the optoelectronic component in accordance with FIG. 5 during chronologically successive production steps, FIG. 12 shows a growth substrate comprising a plurality of optoelectronic components, wherein one optoelectronic component is provided with an identifier, and FIG. 13 shows the growth substrate in accordance with FIG. 12, wherein a plurality of optoelectronic components are provided with a respective identifier.

Hereinafter, identical reference signs may be used for identical features.

FIG. 1 shows an optoelectronic component 101.

The component 101 comprises a substrate 103, on which a semiconductor layer sequence 105 is applied. The semiconductor layer sequence 105 comprises four semiconductor layers 107, 109, 111, 113, which are applied to the substrate 103 in the aforementioned order.

In an exemplary embodiment which is not shown it can be provided that more or fewer than four semiconductor layers are provided for the semiconductor layer sequence.

The semiconductor layer sequence 105 furthermore comprises an identifier 115 for identifying the optoelectronic component 101. In the exemplary embodiment shown in FIG. 1, the semiconductor layer 111 second from the top relative to the substrate 103 comprises the identifier 115. In further exemplary embodiments (not shown) it can be provided that one of the other three semiconductor layers 107, 109, 113 comprises the identifier 115. In further exemplary embodiments (not shown) it can be provided that a plurality of identifiers are provided, which are formed in particular identically or preferably differently.

By virtue of the fact that the semiconductor layer sequence 105 comprises the identifier 115, the optoelectronic component 101 can always be identified unambiguously. Even if, for example, the substrate 103 were now separated from the semiconductor layer sequence 105, an unambiguous identification of the semiconductor layer sequence 105 would nevertheless be made possible, insofar as the identifier 115 is part of the semiconductor layer sequence 105.

By way of example, a position of the semiconductor layer sequence 105 on a growth substrate (not shown here) can be coded in the identifier 115. That is to say, in particular, that the information as to where the semiconductor layer sequence 105 was situated on the growth substrate is coded in the identifier 115. Therefore, in particular the information regarding that location or that position of the growth substrate, in particular of the wafer, at which the semiconductor layer sequence 105 was formed on the growth substrate is coded in the identifier 115.

Consequently, even after the growth substrate has been removed from the semiconductor layer sequence 105, an unambiguous identification of the semiconductor layer sequence 105 is made possible. Therefore, even subsequently, the position at which the semiconductor layer sequence 105 was situated on the growth substrate, in particular on the wafer, can still be ascertained. The knowledge of this position advantageously enables in particular a targeted reduction of a fault rate and thus an increase in a production yield and reliability. After the removal of the semiconductor layer sequence 105 from the growth substrate, said semiconductor layer sequence is preferably applied to the substrate 103 or on a film (not shown here).

FIG. 2 shows a flow diagram of a method for producing an optoelectronic component.

In accordance with a step 201, a semiconductor layer sequence is formed on a growth substrate, for example a wafer. In accordance with a step 203, the semiconductor layer sequence is provided with an identifier for identifying the component.

Preferably, it can be provided that the two steps 201 and 203 are carried out simultaneously. That is to say, in particular, that the identifier is introduced while the individual layers are being applied to the growth substrate. Preferably, it can be provided that after one layer of the layers of the semiconductor layer sequence has been applied, firstly this layer is provided with the identifier, for example by the surface of the layer being structured in a coding fashion. Afterward, the further layers are then applied on the layer having the identifier.

Preferably, it can be provided that the identifier is applied onto or into the semiconductor layer sequence after the formation of the semiconductor layer sequence. By way of example, it can be provided that the topmost semiconductor layer as viewed from the substrate is provided with the identifier. Said topmost layer of the semiconductor layer sequence can be correspondingly structured in a coding fashion on its surface, for example, in order to thus form the identifier.

FIG. 3 shows a further optoelectronic component 301.

The optoelectronic component 301 comprises a substrate 303, on which a semiconductor layer sequence 305 is applied. The semiconductor layer sequence 305 comprises four semiconductor layers 307, 309, 311 and 313, which are arranged on the substrate 303 in the aforementioned order. That is to say, in particular, that the semiconductor layer 313 is the topmost semiconductor layer of the semiconductor layer sequence 305 as viewed from the substrate 303.

In the exemplary embodiment in accordance with FIG. 3, the semiconductor layer 311 formed directly below the semiconductor layer 313, that is to say the topmost semiconductor layer, is formed as an active zone or as an emitter layer which can emit electromagnetic radiation upon electrical and/or optical excitation.

The topmost layer 313 is formed as a coupling-out layer 313 in the optoelectronic component 301. The coupling-out layer 313 advantageously couples out the electromagnetic radiation generated in the emitter layer 311 or active zone.

Furthermore, the semiconductor layer sequence 305 comprises an identifier 315, which is formed as a coded surface structure 317 of the coupling-out layer 313.

That is to say, in particular, that a region or a partial area of the surface of the coupling-out layer 313 was structured in a coding fashion, for example by means of a barcode, in particular a one- or two-dimensional barcode. In particular, it can be provided that a structure in the form of a one-dimensional or two-dimensional binary code, for example in the form of a barcode or a "dot-matrix", is introduced into the surface of the coupling-out layer 113, wherein this structure represents the position of the semiconductor layer sequence 105 on a growth substrate. Said growth substrate can be the substrate 303, for example.

FIG. 4 shows a flow diagram of a further method for producing an optoelectronic component.

In accordance with a step 401, a semiconductor layer sequence is formed on a growth substrate, wherein an active zone for generating electromagnetic radiation or an emitter layer and a coupling-out layer for coupling out the electromagnetic radiation from the active zone or emitter layer are formed. In accordance with a step 403, a region of the surface of the coupling-out layer is structured in a coding fashion. That is to say, in particular, that the semiconductor layer sequence is provided with an identifier, wherein the identifier is formed as a coded surface structure of the coupling-out layer.

FIG. 5 shows a different optoelectronic component 501.

The optoelectronic component 501 comprises a substrate 503, on which a semiconductor layer sequence 505 is applied.

The semiconductor layer sequence 505 comprises five semiconductor layers 507, 509, 511, 513, 515, which are arranged or deposited on the substrate 503 in the aforementioned order.

That is to say, in particular, that the semiconductor layer 515 forms the topmost layer of the semiconductor layer sequence 505 as viewed from the substrate 503.

An emitter layer 513 or an active zone for generating electromagnetic radiation is formed directly below the topmost semiconductor layer 515. The semiconductor layer 511 is formed directly below the emitter layer 513 or active zone. It can preferably be provided that the semiconductor layer 515 is an n-doped semiconductor layer. In this case, the semiconductor layer 511 below the emitter layer 513 is a p-doped layer. In an exemplary embodiment which is not shown, it can be provided that the topmost semiconductor layer 515 is p-doped, wherein the semiconductor layer 511 below the emitter layer 513 is then n-doped.

The semiconductor layer 509 can be embodied as a mirror layer, for example, in order to reflect electromagnetic radiation generated in the semiconductor layer 513 in the direction of the topmost semiconductor layer 515, in order thus advantageously to increase a coupling-out efficiency in respect of coupled-out electromagnetic radiation.

In the exemplary embodiment shown in FIG. 5, the topmost semiconductor layer 515 is simultaneously formed as a coupling-out layer which can advantageously couple out the electromagnetic radiation generated in the emitter layer 513.

In order to identify the semiconductor layer sequence 505, a surface of the topmost semiconductor layer 515 is structured in a coding fashion. That is to say, in particular, that the surface of the coupling-out layer 515 has regions 517 which were or are structured in a coding fashion. These coded surface structures 517 furthermore contribute to an increase in a coupling-out efficiency.

A bonding pad 519 is formed centrally on the surface of the coupling-out layer 515. In a manner spaced apart from the bonding pad 519, a contact web 521 for an electrical contacting of the semiconductor layer sequence 505 is provided in each case on the left and right of the bonding pad 519. The respective area between the contact webs 521 and the bonding pad 519 is structured in a coding fashion and in this respect forms the coded surface structure 517.

An edge region 523 and respectively 525 is formed in each case on the left alongside the left contact web 521 and on the right alongside the right contact web 521, on which edge region for example a surface coating, in particular an antireflection coating can be applied in a further exemplary embodiment (not shown). A location of this surface coating can be chosen in particular depending on a position of the semiconductor layer sequence 505 on a growth substrate. A further possibility of an identification, in particular a position identification, of the semiconductor layer sequence 505 is thus made possible.

In other embodiments (not shown), it can be provided that instead of the coded surface structure only the surface coating, in particular the antireflection coating, is provided as identifier.

FIG. 6 to FIG. 11 in each case show views of the optoelectronic component 501 in different chronologically successive possible production steps in a partial sectional view. That is to say, in particular, that not all of the elements shown in FIG. 5 are illustrated. The illustrated elements may be illustrated in a truncated manner for example for the sake of better clarity.

It is noted that the production steps described below are not intended to restrict the invention. The component shown in accordance with FIG. 5 can also be produced and correspondingly structured in a coding fashion by means of other production methods.

FIG. 6 merely shows the topmost semiconductor layer 515, that is to say the coupling-out layer, of the semiconductor layer sequence 505 in a truncated manner with the bonding pad 519 and the left contact web 521. A surface of the coupling-out layer 515 that lies between the bonding pad 519 and the contact web 521 does not yet have a coded structuring.

In accordance with the view in FIG. 7, a protective layer 701, for example a photoresist, is applied in each case on the contact web 521 and the bonding pad 519 as protection for the structuring steps still to follow.

Figure 8:
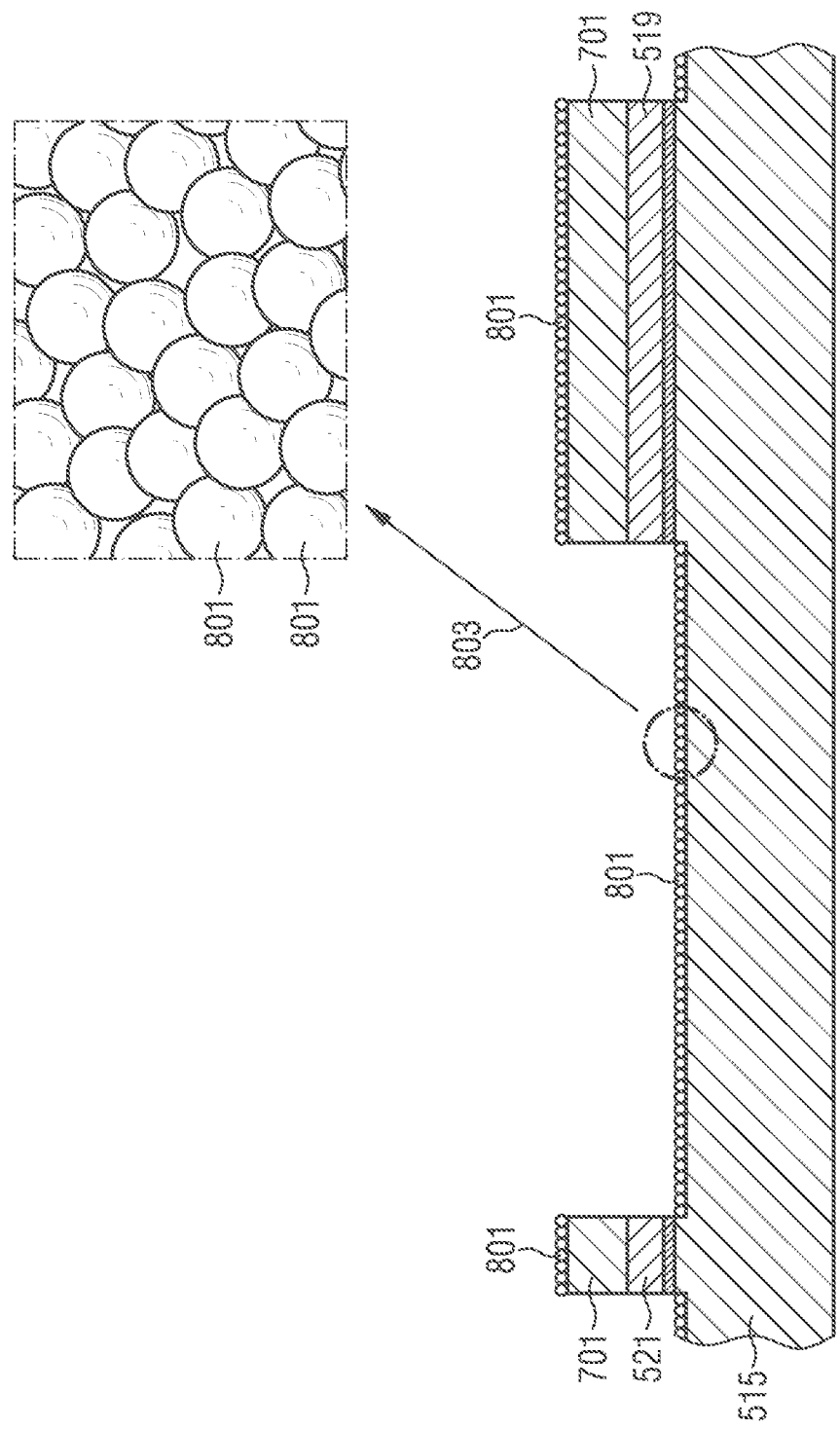

In accordance with the view in FIG. 8, a polystyrene monosphere film is applied to the uncovered surfaces. Said film comprises a multiplicity of spheres (monosphere) 801. Said spheres 801 are formed from polystyrene. The polystyrene monosphere film can be formed in particular as follows:

A suspension is formed from HMDS, isopropanol and polystyrene spheres 801.

HMDS here stands for hexamethyldisilazane and acts in particular in an advantageous manner as an adhesion promoter for photoresist on a hydrophobic wafer surface.

By means of a burette, in particular, said suspension is added to a water surface in a basin in which the optoelectronic component 501 is situated. The suspension is then subsequently distributed in particular on the water surface.

Once the solvent has evaporated, the desired film of polystyrene spheres forms at the surface of the water/air interface. Said film can be deposited on the uncovered surfaces in particular by virtue of the water being drained from the basin. If a wafer comprising a plurality of semiconductor layer sequences, that is to say comprising a plurality of optoelectronic components is provided, then the film of polystyrene spheres deposits on the wafer, that is to say in particular on the uncovered surfaces of the individual components.

The polystyrene spheres 801 advantageously serve for a masking for photolithographic process steps still to follow for a roughening of the surface of the coupling-out layer 515 for an improved coupling out of the electromagnetic radiation.

By way of example, the suspension can comprise 20 ml isopropanol, 0.2 ml PS (polystyrene spheres) suspension, 20 ml HMDS, wherein another 10 ml HMDS can be provided in the water in the basin.

FIG. 8 furthermore shows an enlarged excerpt from a view obliquely from above of the film of polystyrene spheres 801. Said enlarged excerpt is identified by an arrow bearing the reference sign 803.

Figure 9:
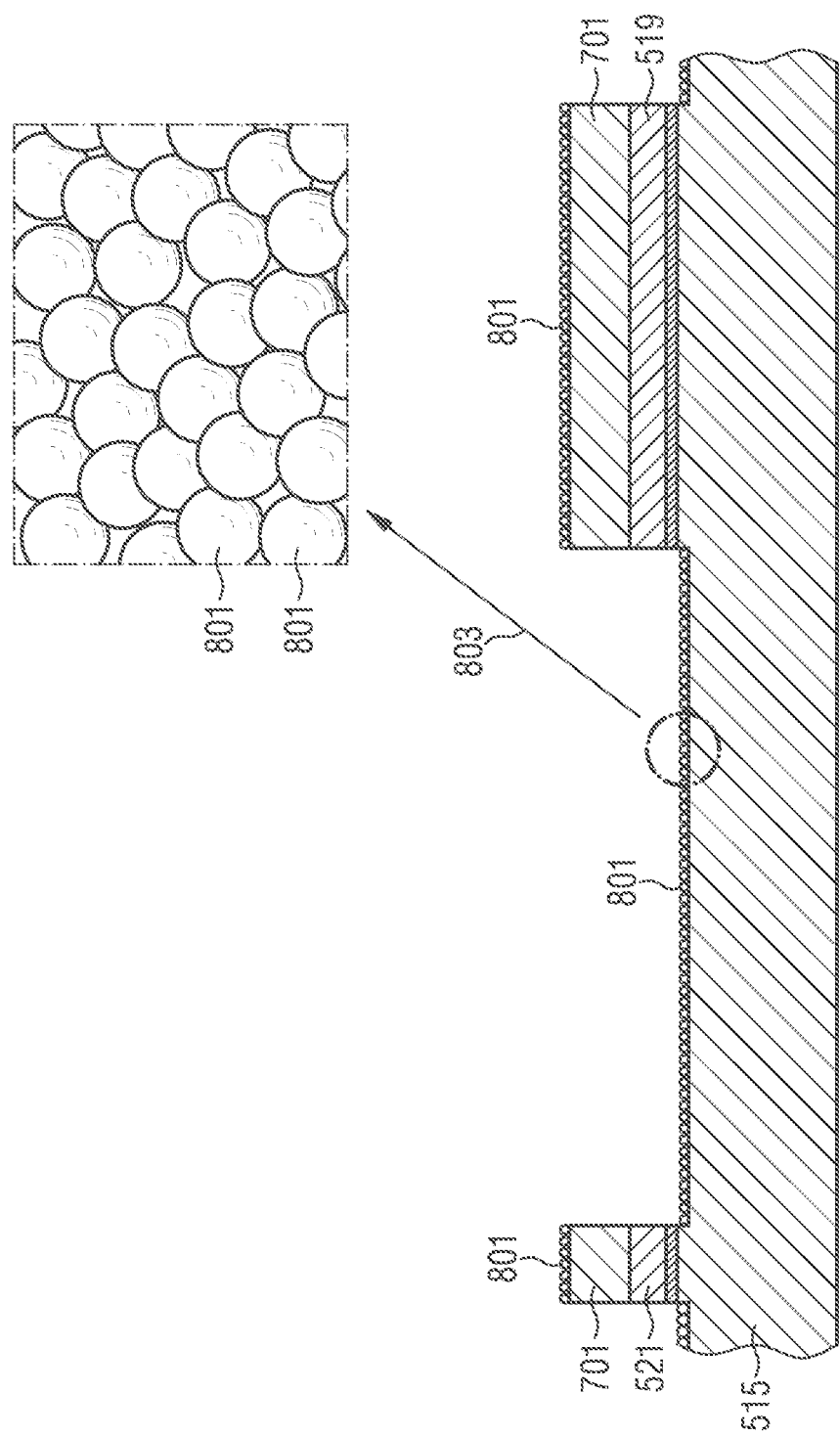

The view in accordance with FIG. 9 shows the polystyrene spheres 801 after a shrinkage process and after a transfer of the sphere structure to the surface of the coupling-out layer 515. Said shrinkage process is optional insofar as the specific desired size of the spheres 801 is dependent on the wavelength of the emitted electromagnetic radiation.

In this regard, for a particularly good coupling-out efficiency, the spheres 801 should have a diameter of approximately 425 nanometers if electromagnetic radiation having a wavelength of 850 nanometers is intended to be emitted.

If, for example, only spheres having a size of 430 nanometers are used, then in this respect they are subsequently shrunk to the corresponding desired size, here 425 nanometers, after the application of the film.

FIG. 10 shows a view of the component after ashing of the polystyrene spheres 801. That is to say, in particular, that the polystyrene spheres 801 were destroyed by means of heating, for example, such that ultimately only the correspondingly structured surface of the coupling-out layer 515 remains. This structured surface is identified here by the reference sign 1001. That is to say, in particular, that the structure of the film of polystyrene spheres 801 has now been transferred to the surface of the coupling-out layer 515. This surface can be structured in a coding fashion beforehand or subsequently.

In order to form the coding structure 517, it is provided, in particular, that the surface of the layer 515 and/or a photoresist applied to the surface of the layer 515 is structured in a coding fashion by means of photolithography and/or imprint and/or laser beam and/or electron beam methods. That is to say, in particular, that as yet no coding structure is formed by means of the roughening on account of the spheres 801. Said coding structure is formed in particular by means of the aforementioned methods. In particular, the roughening by means of the spheres 801 takes place after the formation of the coded structure.

In accordance with FIG. 11, the protective layer 701, in particular the photoresist, is removed from the bonding pad 519 and from the contact web 521.

A plan view of the optoelectronic component 501 is designated by the reference sign 1101. The bonding pad 519 can form here in particular a metallic n-type contact for the layer 515 if the latter is an n-doped layer.

It is noted at this juncture that the abovementioned roughening by means of spheres 801 is intended to serve merely as an example, but not as a restriction. By means of the sphere roughening, a roughening of the surface of the layer 515 is brought about in such a way that light can be coupled out particularly efficiently. This type of roughening can be carried out in further embodiments (not shown) alternatively or additionally by means of other roughening methods: for example photolithography methods and/or imprint methods.

FIG. 12 shows a growth substrate 1201, in particular a wafer, on which a multiplicity of semiconductor layer sequences are applied alongside one another. Said semiconductor layer sequences are not shown, for the sake of clarity. A barcode 1203 is shown, which is applied to a surface of a topmost layer of the semiconductor layer sequence, in particular of a coupling-out layer, by means of the surface of the topmost layer being correspondingly structured in a coding fashion in order thus to code a position of the semiconductor layer sequence into the surface.

FIG. 13 shows the growth substrate 1201, wherein a plurality of surfaces of the individual semiconductor layer sequences have already been correspondingly structured in a coding fashion.

The invention therefore encompasses, in particular, the concept of providing a surface of a semiconductor layer, in particular the surface of the coupling-out layer, at least partly or else the whole area, by means of an imprint method and/or a photolithography method with subsequent etching or other structuring methods, with a structure for example in the form of a one-dimensional or two-dimensional binary code, for example a barcode or a dot matrix, wherein the structure represents a position of the semiconductor layer sequence on the wafer, that is to say the growth substrate. It can be provided, for example, that the semiconductor layer surface is etched. In particular, a selective, that is to say location-dependent coating of additional layers on the topmost semiconductor layer can be carried out.

In particular, said additional layers can be antireflection layers. That is to say, in particular, that the antireflection coating is applied to the surface of the topmost semiconductor layer as viewed from the wafer, wherein a location of the antireflection coating is chosen depending on a position of the semiconductor layer sequence on the wafer.

Consequently, it is advantageously possible to read out the structure or generally the identifier routinely during an automatic final inspection. In particular, it is advantageously possible to evaluate said structure in a microscope in subsequent analyses. It can be provided that the structure size is of a magnitude in particular such that it can still advantageously be identified despite a superimposed roughening by means of spheres, in particular polystyrene spheres. In particular, it can be provided that the structure is so finely structured that it simultaneously serves for coupling out the electromagnetic radiation in addition to or instead of the roughening by means of the spheres. In general, the surface of a coupling-out layer is roughened in order to increase a coupling-out efficiency.

That is to say, in particular, that provision can be made, for example, for roughening the surface of the topmost semiconductor layer, in particular of the coupling-out layer, at least partially, in particular over the whole area, wherein the roughening is introduced in the form of a binary code structure, for example a dot matrix or a barcode. Very generally, the marking or the identifier, in particular, is preferably formed directly in a region of the semiconductor layer sequence that emits electromagnetic radiation. This region is formed in particular on the surface of the coupling-out layer. That is to say, in particular, that the radiation generated in the active zone leaves the semiconductor layer sequence through this region.

Consequently, the position of each individual optoelectronic component on the wafer can still be reproduced even after a separation, without additional costs arising or a performance of the optoelectronic components decreasing. By virtue of the knowledge of the position or of the location of the optoelectronic components, many fault causes can be identified more rapidly afterward. By way of example, it is possible to identify whether the optoelectronic component is a component which was situated at the edge or in an edge region of the wafer. Consequently, a quality can be improved in an advantageous manner.

Although the invention has been more specifically illustrated and described in detail by means of the preferred exemplary embodiments, nevertheless the invention is not restricted by the examples disclosed, and other variations can be derived therefrom by the person skilled in the art without departing from the scope of protection of the invention.

The invention claimed is:

1. An optoelectronic component, comprising:
   a substrate, on which a semiconductor layer sequence is applied,
   wherein the semiconductor layer sequence has at least one identifier for identifying the component,
   wherein the identifier comprises a coded structured region of a layer of the layers of the semiconductor layer sequence,
   wherein the semiconductor layer sequence comprises a coupling-out layer,
   wherein the coded structured region comprises a coded surface structure of the coupling-out layer, and
   wherein the coupling-out layer comprises a roughening in the form of the coded surface structure.

2. The optoelectronic component according to claim 1, wherein the coded structured region is formed as a barcode.

3. The optoelectronic component according to claim 1, wherein the region comprises a coded structured surface coating of the layer.

4. The optoelectronic component according to claim 3, wherein the surface coating is an antireflection coating.

5. The optoelectronic component according to claim 1, wherein the semiconductor layer sequence comprises an active zone for generating electromagnetic radiation and a coupling-out layer for coupling out the electromagnetic radiation from the active zone, wherein the coded structured region comprises a coded surface structure of the coupling-out layer.

6. A method for producing an optoelectronic component, wherein a semiconductor layer sequence is formed on a growth substrate,
   wherein the semiconductor layer sequence is provided with an identifier for identifying the component
   wherein the identifier comprises a coded structured region of a layer of the layers of the semiconductor layer sequence,
   wherein the semiconductor layer sequence comprises a coupling-out layer,
   wherein the coded structured region comprises a coded surface structure of the coupling-out layer, and
   wherein the coupling-out layer comprises a roughening which is introduced in the form of the coded surface structure.

7. The method according to claim 6, wherein a position of the semiconductor layer sequence on the growth substrate is coded into the identifier.

8. The method according to claim 7, wherein forming the coded structured region comprises applying a coded structured surface coating on the layer, wherein a location of the surface coating on the layer is chosen depending on the position of the semiconductor layer sequence on the growth substrate.

9. The method according to claim 8, wherein the surface coating is formed as an antireflection coating.

10. The method according to claim 7, wherein a location of the coded surface structure on the coupling-out layer is chosen depending on the position of the semiconductor layer sequence on the growth substrate.

11. The method according to claim 6, wherein the step of providing comprises forming a coded structured region of a layer of the layers of the semiconductor layer sequence.

12. The method according to claim 11, wherein forming the semiconductor layer sequence comprises forming an active zone for generating electromagnetic radiation and forming a coupling-out layer for coupling out the electromagnetic radiation from the active zone, wherein forming the coded structured region comprises forming a coded surface structure of the coupling-out layer.

13. The method according to claim 12, wherein forming the coded surface structure is carried out by means of an imprint method and/or a photolithography method.

14. An optoelectronic component, comprising a substrate, on which a semiconductor layer sequence is applied,
    wherein the semiconductor layer sequence has at least one identifier for identifying the component, wherein the identifier comprises a coded structured region of a layer of the layers of the semiconductor layer sequence,
wherein the semiconductor layer sequence comprises an active zone for generating electromagnetic radiation and a coupling-out layer for coupling out the electromagnetic radiation from the active zone,
wherein the coded structured region comprises a coded surface structure of the coupling-out layer, and
wherein the coupling-out layer comprises a roughening in the form of the coded surface structure and the roughening faces away from the substrate.

* * * * *